United States Patent [19]

Basi

[11] 4,050,954
[45] Sept. 27, 1977

[54] SURFACE TREATMENT OF SEMICONDUCTOR SUBSTRATES

[75] Inventor: Jagtar S. Basi, Fishkill, N.Y.

[73] Assignee: International Business Machines Corporation, Armonk, N.Y.

[21] Appl. No.: 670,508

[22] Filed: Mar. 25, 1976

[51] Int. Cl.$^2$ ............................................. C03C 23/00
[52] U.S. Cl. ........................................... 134/2; 134/28
[58] Field of Search .................................. 134/2, 3, 28

[56] References Cited

U.S. PATENT DOCUMENTS 2,690,383   9/1954   Bradshaw ............................ 134/2 X

FOREIGN PATENT DOCUMENTS 7,207,411   11/1967   Japan ...................................... 134/3

OTHER PUBLICATIONS

J. Electrochem. Soc., *Solid-State Science & Technology*, vol. 120, No. 9, Sept. 1973 – "Silicon Surface Contamination: Polishing and Cleaning", R. L. Meek et al., pp. 1241-1246.

Solid State Technology, Nov. 1975, "LSI Wafer Cleaning Techniques", D. Tolliver, pp. 33-36.

Russian – Journal of Applied Chemistry, 31-11833 (1958) pp. 1183-1190, "Influence of the pH of the Medium and the Temperature on the Proportions of Active Oxidizing Agents in Hypochlorite Solutions in Chlorination and Bleaching Processes" by I. E. Flis.

*Primary Examiner*—Arthur D. Kellogg
*Attorney, Agent, or Firm*—Henry Powers

[57] ABSTRACT

The invention comprehends establishing a hydrophilic surface on polished semiconductor wafers, such as silicon, after polishing (e.g. silica polishing) by oxidation and hydrolysis of the wafer surface for conditioning thereof for post-polishing cleaning.

13 Claims, No Drawings

SURFACE TREATMENT OF SEMICONDUCTOR SUBSTRATES

FIELD OF THE INVENTION

This invention relates to the conditioning of semiconductor wafers, and more particularly to treatment of semiconductor surfaces for cleaning thereof after polishing.

DESCRIPTION OF THE PRIOR ART

Semiconductor devices such as monolithic circuits, diodes, passive devices and the like, are formed by various additive techniques, such as diffusion and epitaxial growth, in the planar surfaces of semiconductor substrates. For such semiconductor fabrication, polished silicon wafers, free of undesirable crystal defects and surface imperfections, is a basic requirement. Polishing and cleaning of the wafers is normally the last process in preparation of the wafers for device fabrication.

The nature of the wafer surface after polishing is determined mainly by the particular polishing process employed, e.g. the nature of the polishing slurry, polishing temperature, pressures relative to polishing pads, wafer holding techniques during polishing, etc. Normally, the slurry and polishing reaction products are deposited and retained on the polished wafer surface to varying degrees on completion of the polishing step. As a result, the polished wafers require extensive cleaning before further use for device fabrication.

For metal oxide-based (e.g. silica) polishing process, the cleaning operations heretofore have employed, rinsing and water wheeling wafers with water and surfactants, demounting and dewaxing wafers with various organic solvents, hot acid treatments with nitric acid, sulfuric acids and the like, dilute hydrofluoric acid treatments, water rinsing, brush cleaning and drying. Although such cleaning operations have heretofore been adequate, they are characterized with shortcoming with increasing requirement for densification of integrated circuits.

SUMMARY OF THE INVENTION

It has been found that inadequacies in cleaning of silicon wafers polished with metal oxide (e.g. silica, $SiO_2$ based slurries are due to the induced hydrophobic surface on and/or polishing particles embedded in the silicon wafer. Also, colloidal or microcrystalline polishing slurry particles tend to stay on the wafer surface in an extremely thin layer which, if allowed to dry, forms a thin film which heretofore has resisted complete removal by conventional cleaning operations.

Analysis has indicated that the hydrophobic nature of metal oxide (e.g. silica) polished wafers is probably due to the formation of —Si—O—Si— bonds on the surface as a result of the relatively high temperatures produced by the mechanically abrasive interaction of the slurry with the silicon surface, and also reaction with the base where employed in conjunction with metal oxide polishing composition. Fast flushing and/or scrubbing helps to remove the slurry film to a significant extent to produce a wafer that normally appears to be clean under normal light conditions. However, close observation under bright light, or other refined techniques, shows large amounts of residue on the wafer surface which is resistant to scrubbing operations which if too vigorously applied can cause sub-surface damage in the silicon wafer. The extent of this damage is basically dependent on the particular equipment, processing conditions and solvents employed.

It has been found that contamination can be significantly removed from polished silicon wafer surfaces by controllably converting the wafer surfaces to hydrophilic (and optionally to hydrophobic again) conditions during cleaning operations.

Specifically, removal of polishing slurry particles and heavy metal ions can be effected by establishing a hydrophilic surface on the wafer. Analysis indicates that this is accomplished by alteration of the nature of the bonding of the oxide, which appears to be as follows:

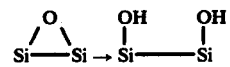

Such conversion of the wafer surface to a hydrophilic state can be obtained by the use of oxidizing agents, alkali metal hypohalites and the dichromate and permanganate in sulfuric acid. These oxidizing agents not only convert the silicon surface to hydrophilic form but can also coagulate colloidal silica (when used as the polishing medium) which can then be removed by mere water rinsing.

This coagulation of silica with the hypohalite oxidizing agents is clearly contrasted to the coagulation with alkali metal halides (e.g. NaCl, NaBr, etc.) which coagulate silica in a form which precipitates on the silicon surface in thin films which could not be removed by simple rinsing.

Also, as is known, electrochemical equillibrium calculations of $Si/H_2O$ systems show that silicon is an extremely strong reducing agent, whereby in the presence of strong oxidizing agents, such as sodium hypochlorite, the silicon surface is also oxidized. As a result, this facilitates the removal of any silica particles which become embedded in the silicon surface during polishing operations. Strong oxidizing agents also oxidize organic contaminants.

The oxidizing operation is then followed by treating the silicon surface, by immersion, in dilute $NH_4OH$, water rinse and spin drying. The use of the ammonium hydroxide enables the removal by complex ion formation with any heavy metal ions remaining on the silicon surface as a result of the polishing operation or the previous cleaning step employing oxidation. Also, the ammonium hydroxide facilitates the removal of sodium ions. Any ammonia adsorbed on the silicon surface readily volatilizes without leaving any harmful residues. Also, the anti-static nature of ammonia solution helps to remove adhering particles from the wafer surface.

Accordingly, it is an object of this invention to provide a novel method of producing semiconductor surfaces of uniform high quality.

It is another object of this invention to provide a novel method of conditioning semiconductor surfaces for device fabrication.

It is also an object of this invention to provide a novel method of removing contamination from polished surfaces of semiconductors.

The foregoing and other objects, features and advantages of the invention will be apparent from the following more particular description of preferred embodiments of the invention.

DESCRIPTION OF PREFERRED EMBODIMENTS

The following processing schedules show various steps involved in practicing this invention for cleaning silicon wafers polished with Monsanto Company's trademarked silica sol composition "Syton HT-50" in a free polishing machine such as described in Goetz et al., U.S. pat. No. 3,691,694 including modifications thereof in accordance with the planetary configuration of Goetz et al. shown in the IBM Technical Disclosure Bulletin (e.g. TDB), pp. 1760–1761, vol. 15, No. 6, November 1972.

EXAMPLE 1

A. Immerse for 3 minutes in 1% aq. NaClO solution.
B. Rinse for 2 minutes in flowing DI (deionized) water.
C. Immerse for 30 seconds in aq. 3% NH$_4$OH solution.
D. Rinse for 2 minutes in flowing DI water.
E. Immerse for 15 seconds in aq. 5% HF to establish a hydrophobic condition on the wafer surface and remove silicon oxide therefrom.
F. Rinse for 2–3 minutes in flowing DI water.
G. Immerse for 3 miutes in aq. 1% NaClO.
H. Repeat Step B.
I. Repeat Step C.
J. Rinse for 5 minutes in flowing DI water.
K. Spin dry.

In the above process, wafers with excellently cleaned surfaces were obtained after Step D which were acceptable for device fabrication. However, examination indicated the presence of some particles on the wafer surface which were hard to remove by brush cleaning, without any significant difference in particle removal even though the immersion time in NaClO of Step A was increased. Removal of these particles is obtained on completion on immersion in HF in Step. E.

EXAMPLE 2

Fifteen free polished silicon wafers (as in Example 1) were cleaned in accordance with the following schedule.

A. Immersion for 3 minutes in aq. 5% NaClO.
B. Rinsing for 2 minutes in flowing DI water.
C. Immersion for 30 seconds in aq. 3% NH$_4$OH solution.
D. Rinsing for 5 minutes in flowing DI water, and spin drying.
E. Brush cleaning.

Of the fifteen wafers cleaned, four were rejected for scratches and edge chips, not due to the cleaning operation, but resulting from polishing operations.

The remaining eleven wafers easily met the high criterias set for the wafers, wherein the front face was specular, free from scratches, stains and adhering particles.

The backside of the remaining wafers did not show any loose dirt or staining under ambient conditions, and the wafers were found acceptable for device fabrication.

EXAMPLE 3

In cases of wax mounted polishing processes, the cleaning sequence is modified in accordance with the following schedule.

A. Expose wax mounted silicon wafer to aq. 5% NaClO for 5 minutes.
B. Rinse for 5 minutes in flowing DI water, and dry.
C. Demount and de-wax wafer with organic solvents such as trichloro ethylene, and methyl or propylalcohol.
d. Immerse wafers for 5 minutes in aq. 5% NaClO solution.
E. Rinse for 2 minutes in flowing DI water.
F. Immerse wafers for 30 seconds in aq. NH$_4$OH.
G. Rinse wafers in flowing DI water and dry.

Process steps E to G can be readily carried out in the commercially available automated Corotek (Model No. COR II-CX) spin dryer. However, its use requires careful control in the pressure of its N$_2$ environment to prevent staining of the wafer.

It may be noted that care must be taken to insure complete rinsing in step E to prevent the formation of chloramine and other oxidation products of ammonia in the wash liquid which are undesirable from safety and pollution point of view.

Typical surface impurity analysis of wafers cleaned, in accordance with this invention, and employing Emission Spectographic techniques, showed the following results.

| Element | Impurity Level atoms/cm$^2$ |
|---|---|
| Al | N.D. (not detected) |
| Na | N.D. |
| Ca | N.D. |
| Fe | N.D. |
| Cr | N.D. |
| Cu$^{++}$ | N.D. - 4 × 10$^{12}$ |
| Ti | N.D. |
| Mg | N.D. |

EXAMPLE 4

The cleaning schedule of Example 2 was repeated for six polished silicon wafers with the exception that chromic acid was used in Step A in place of sodium hypochlorite.

As in Example 2, these wafers also met the high specifications set for them, as discussed in Example 2.

While this invention has been particularly described with reference to the preferred embodiments thereof, it will be understood by those skilled in the art that the foregoing and other changes in form and details may be made therein without departing from the spirt and scope of the invention.

What is claimed is:

1. In a method of cleaning a silicon wafer polished with a metal oxide polishing medium, the improvement comprising: establishing hydrophilic surfaces on said wafer by oxidation thereof with an oxidizing agent selected from the group consisting of alkali metal hypohalites, and dichromates and permanganate salts of alkali metals in sulfuric acid, and including the step of treating the hydrophilic formed surfaces with an NH$_4$OH solution.

2. The method of claim 1 wherein said metal oxide is silica.

3. The method of claim 2 wherein said oxidizing agent is sodium hypochlorite.

4. The method of claim 1 including the step of converting said hydrophilic surfaces to a hydrophobic state by treatment with hydrofluoric acid solution.

5. The method of claim 4 including the further step of re-establishing a hydrophilic condition to said surfaces by retreatment with said oxidizing agents.

6. The method of claim 5 wherein said metal oxide is silica.

7. The method of claim 6 wherein said oxidizing agent is sodium hypochlorite.

8. In a method of cleaning silicon wafers polished with a metal oxide polishing medium, the improvement comprising:

a. establishing hydrophilic surfaces on said wafers by oxidation with an oxidizing agent selected from the group consisting of alkali metal hypohalites, and dichromate and permanganate salts of alkali metals in sulfuric acid;

b. treating said hydrophilic surfaces with an $NH_4OH$ solution to remove metal ions therefrom remaining from said polishing medium, c. establishing hydrophobic surfaces on said wafers by treatment with hydrofluoric acid solution and concurrently removing oxides therewith from said surfaces; and d. reconverting said surfaces to a hydrophilic condition with re-treatment with said oxidizing agent.

9. The method of claim 8 wherein said metal oxide is silicon dioxide.

10. The method of claim 9 wherein said oxidizing agent is sodium hypohalite.

11. The method of claim 8 wherein said improvement is repeated at least once.

12. The method of claim 11 wherein said metal oxide is silicon dioxide.

13. The method of claim 12 wherein said oxidizing agent is sodium hypohalite.

* * * * *